(12) United States Patent
Musgrove et al.

(10) Patent No.: US 9,576,076 B2
(45) Date of Patent: Feb. 21, 2017

(54) CATALOG TAXONOMY FOR STORING PRODUCT INFORMATION AND SYSTEM AND METHOD USING SAME

(75) Inventors: Timothy A. Musgrove, Morgan Hill, CA (US); Robin Hiroko Walsh, San Francisco, CA (US)

(73) Assignee: CBS Interactive Inc., San Francisco, CA (US)

( * ) Notice: Subject to any disclaimer, the term of this patent is extended or adjusted under 35 U.S.C. 154(b) by 944 days.

(21) Appl. No.: 13/208,322

(22) Filed: Aug. 11, 2011

(65) Prior Publication Data

US 2011/0295895 A1   Dec. 1, 2011

Related U.S. Application Data

(60) Continuation of application No. 11/498,065, filed on Aug. 3, 2006, now Pat. No. 8,019,659, which is a division of application No. 10/460,681, filed on Jun. 13, 2003, now abandoned.

(51) Int. Cl.
  *G06F 17/30*   (2006.01)
  *G06F 17/50*   (2006.01)
  *G06Q 50/00*   (2012.01)

(52) U.S. Cl.
  CPC ... *G06F 17/30994* (2013.01); *G06F 17/30327* (2013.01); *G06F 17/30528* (2013.01); *G06F 17/50* (2013.01); *G06Q 50/00* (2013.01)

(58) Field of Classification Search
  USPC ........................................ 707/758, 777, 999
  See application file for complete search history.

(56) References Cited

U.S. PATENT DOCUMENTS

| | | | | |
|---|---|---|---|---|
| 6,055,515 A | * | 4/2000 | Consentino | G06F 3/0481 705/27.1 |
| 6,085,187 A | * | 7/2000 | Carter | G06F 17/30398 |
| 6,360,216 B1 | * | 3/2002 | Hennessey | G06F 17/30392 |
| 6,466,918 B1 | * | 10/2002 | Spiegel | G06F 17/30873 705/27.1 |
| 6,625,619 B1 | * | 9/2003 | McClendon | G06F 17/30873 |

(Continued)

OTHER PUBLICATIONS

Adams: "The semantic web: differentiating between taxonomies and ontologies," Online, Jul./Aug. 2002 v26i4 p. 20; Proquest #274960671, 6pgs.

(Continued)

*Primary Examiner* — Hosain Alam
*Assistant Examiner* — Ahmed Abraham
(74) *Attorney, Agent, or Firm* — Marc S. Kaufman; Reed Smith LLP

(57) ABSTRACT

A catalog taxonomy organized in a tree-like configuration including at least one first tier product category having at least one first tier attribute associated with products in the first tier category, and a plurality of second tier product categories branching from the first tier product category and defining subcategories, at least one of the plurality of second tier product categories having a second tier attribute associated with products in a subcategory defined by the plurality of second tier product categories, wherein each of the second tier product categories inherits the first tier attribute of the first tier product category from which the plurality of second tier product categories branches. In addition, a system and method utilizing such catalog taxonomy.

12 Claims, 8 Drawing Sheets

(56) References Cited

U.S. PATENT DOCUMENTS

| | | | | |
|---|---|---|---|---|
| 2001/0044758 A1* | 11/2001 | Talib | ................ | G06F 17/30622 |
| | | | | 705/26.1 |
| 2002/0077921 A1* | 6/2002 | Morrison | ............... | G06Q 30/02 |
| | | | | 705/26.1 |
| 2002/0143669 A1* | 10/2002 | Scheer | ................ | G06Q 10/087 |
| | | | | 707/999.1 |
| 2003/0061122 A1* | 3/2003 | Berkowitz | ........ | G06F 17/30873 |
| | | | | 707/999.1 |
| 2003/0182196 A1* | 9/2003 | Huang | .................. | G06Q 30/02 |
| | | | | 707/999.1 |
| 2004/0143584 A1* | 7/2004 | Chun | ................. | G06F 17/3089 |
| | | | | 707/999.1 |

OTHER PUBLICATIONS

Ghiselli: "A unified access to extract knowledge from heterogeneous web archives," Online Information Review, 2001 v25i5 p. 299; Proquest #269206091, 15pgs.

Kalfoglou: "Ontology mapping the state of the art," The Knowledge Engineering Review, Jan. 2003, v18:1, 1-31, 33pgs.

Timothy A. Musgrove, et al., "Catalog Taxonomy for Storing Product Information and System and Method Using Same", U.S. Appl. No. 10/460,681, filed Jun. 13, 2003, pending.

* cited by examiner

CATALOG TAXONOMY FOR STORING PRODUCT INFORMATION AND SYSTEM AND METHOD USING SAME

This application is a Continuation of U.S. patent application Ser. No. 11/498,065, filed on Aug. 3, 2006, which is a Divisional of U.S. patent application Ser. No. 10/460,681, filed on Jun. 13, 2003, the disclosures of which is incorporated herein by reference.

BACKGROUND OF THE INVENTION

Field of the Invention

The present invention is directed to a catalog taxonomy and systems and methods for storing product information in a catalog. In particular, the present invention is directed to a catalog taxonomy in which product categories and subcategories are organized in multiple tiers, and a system a method that utilizes such catalog taxonomy.

Description of Related Art

Various on-line services and merchants provide on-line catalogs that allow users to obtain information regarding many different types of products and/or purchase these from various different product categories. For example, on-line merchants such as www.amazon.com™ provide various tabs for categories of products in their catalog including tabs for books, apparel, electronics, etc. Upon selection of one of these tabs representing a category, a listing of plurality of subcategories is generated for selection by the user. Upon selection of a subcategory, further subcategories or plurality of products are displayed so that the user can again, select the desired subcategory to display the products of the subcategory, or select the desired product to obtain information and/or purchase the desired product.

Websites such as www.cnet.com™ and www.mysimon.com™ that provide users with product information and reviews, as well as www.yahoo.com™ which is a search site, provide links to catalogs that allow users to shop for products from a various on-line merchants that sell the desired product. Upon selection of an appropriate shopping link, these websites typically display a catalog with a plurality of product categories to allow the user to select a desired category of products. The user interface of the catalog then functions in a similar manner to the interface provided by on-line merchants such as described above. In particular, upon selection of a category, a plurality of subcategories are displayed to allow the user to select the desired subcategory of products. Upon selection of a subcategory, further subcategories or plurality of products are displayed so that the user can select the desired subcategory, or select the desired product.

The above described catalogs have user interfaces with ontological structures as described in which a plurality of product subcategories branch from parent product categories or parent subcategories so that the catalogs also have a tree-like configuration. Such ontological structure of user interfaces for catalogs is desirable to enhance the experience of the user so that the user can quickly and easily navigate through the catalog and identify the desired product. Such ease of use is very important because many different categories of products from many different manufacturers are generally made available to the users by on-line merchants and services.

In particular, on-line services and merchants typically offer various types of products within a given category of products, each group of products targeting a particular group of users and/or meeting the specific needs of a market segment. As previously described, to allow proper organization of products, various subcategories of products are provided for a particular category. For example, in the product category of computing devices, various subcategories may include PDAs, personal computers, or enterprise servers. In the subcategory of personal computers, the computing device may also include the subcategories of desktop and notebook computers, etc. Similarly, in the product category of vacuum cleaners, categories may include whether the vacuum cleaner is upright, canister or handheld. In the subcategory of upright vacuums, additional subcategories may be provided such as bag/bagless operation, with/without exhaust filtration, self-propelled or not, etc.

As described above, the tree-like ontological structures that have plurality of product subcategories branching from parent product categories or parent subcategories are well suited for user providing interfaces of catalogs. On-line merchants as well as other on-line services typically utilize a catalog taxonomy structure that is similarly organized in a tree-like configuration to organize the actual product information that is displayed or rendered in accordance with the tree-like ontological structure of the catalog.

The distinction between the terms "taxonomy" and "ontology" (and variations thereof) as used herein should be clearly understood. Taxonomy as referred to herein can be thought of as a set of relations among categories. Taxonomy may be representable as an acyclic graph, for example, a "tree" graph, such that every relation is "a kind of" relation (i.e. categories are related), and that for every such relation, there is a set of attributes, jointly necessary and individually sufficient for a product to genuinely be "a kind of" product to which that node in the taxonomy refers. Of course, there can also be non-essential or optional attributes as well. Taxonomy does not allow multiple inheritance so that the graph representing the taxonomy cannot be cyclic.

In contrast, ontology as referred to herein may be thought of as a set of relations representable by either an acyclic or cyclic graph, which may or may not mirror (either partly or completely) an underlying taxonomy. Rather than being limited to the conditions of taxonomy described above, ontology may group products together which merely share an affinity, are associated with the same lifestyle, occasion or purpose, etc. In this sense ontologies are used primarily for "navigation" of an "information space" or for "browsing", etc., rather than for strict functional or material classification of products. The items in every node of a well-formed ontology will indeed share certain attributes. However, these attributes are not required to be internal, material properties to the products themselves. They can be secondary properties such as "styled to appeal to youths" or "products on clearance sale."

FIG. 1 shows a schematic illustration of an example conventional catalog taxonomy structure 100 that is organized in a tree-like manner with plurality of product subcategories branching from parent product categories or parent subcategories. As shown, a plurality of $1^{st}$ Tier Categories 104 are provided in the catalog taxonomy structure, each of the plurality of $1^{st}$ Tier Categories 104 having a plurality of $2^{nd}$ Tier categories 108 branching therefrom. The $1^{st}$ Tier Categories 104 may be any appropriate categories of products or services. For example, $1^{st}$ Tier Category 2 may be the category of Computing Devices as shown, while the $1^{st}$ Tier Category 1 may be for audio/video electronics and the $1^{st}$ Tier Category 3 may be for household electronics.

A plurality of product $2^{nd}$ Tier Categories 108 branching from the $1^{st}$ Tier Categories 104 may be any appropriate subcategories thereof. For example, in the illustrated conventional catalog taxonomy structure 100, various subcategories branching from the $1^{st}$ Tier Category 2 for Computing Devices may include the $2^{nd}$ Tier Category 1 for PDAs, $2^{nd}$ Tier Category 2 for PCs, and $2^{nd}$ Tier Category 3 for Servers.

Various products 110 branch from the $2^{nd}$ Tier Categories 108 that are the final or last subcategories in this example. For example, in the illustration of FIG. 1, the $2^{nd}$ Tier Category 1 for PDAs is a final subcategory so that a plurality of products 110 which are various models of PDAs branch therefrom. Similarly, the $2^{nd}$ Tier Category 3 for Servers is a final subcategory so that a plurality of products 110 which are various models of Servers branch therefrom.

Referring again to the conventional catalog taxonomy structure of FIG. 1, $3^{rd}$ Tier Categories 114 branch from the $2^{nd}$ Tier Category 2 for PCs. In particular, the $3^{rd}$ Tier Category 1 for Desktops, and the $3^{rd}$ Tier Category 2 for Notebooks, both branch from the $2^{nd}$ Tier Category 2 for PCs. These $3^{rd}$ Tier Categories for Desktops and Notebooks are the final subcategories in this example. Consequently, a plurality of products 116 branch from these $3^{rd}$ Tier Categories as shown, these products being desktops and notebooks.

In the commonly used catalog taxonomy structure, attributes of the products such as its characteristic features, are associated with the final (last) subcategory. Thus, the various parent categories and parent subcategories of the catalog taxonomy merely provide an organizational structure for organizing product information and do not have any associated attributes themselves Thus, in the catalog taxonomy structure 100, product information of the various products classified under the $1^{st}$ Tier category 2 for Computing Devices are all associated with the final subcategory.

For instance, for the $2^{nd}$ Tier Category 1 for PDAs which is a final subcategory, various attributes of PDAs are associated with the subcategory. In particular the attributes of physical size of PDAs such as height, width, depth, and weight, as well as input/output attributes such as keyboard, viewscreen, touchscreen, mini-keyboard, and handwriting recognition, are all associated with the $2^{nd}$ Tier Category 1 for PDAs. Similarly, various attributes including the physical size attributes (height, width, depth, and weight), the input attributes (keyboard), and storage attributes such as hard drive, floppy, CD and/or DVD are also associated with the $2^{nd}$ Tier Category 3 which is also a final subcategory.

Furthermore, with respect to the $3^{rd}$ Tier Category 1 for Desktops and $3^{rd}$ Tier Category 2 for Notebooks that branch from the $2^{nd}$ Tier Category 2 for PCs, various attributes are associated with these subcategories as well. As shown in FIG. 1, the $3^{rd}$ Tier Category 1 for Desktops is associated with physical attributes (height, width, depth, weight), input/output attributes (keyboard, viewscreen), storage attributes (hard drive, floppy, CD/DVD), and form factor attributes such as horizontal, tower, and mini-tower form factors. Similarly, the $3^{rd}$ Tier Category 2 for Notebooks has various associated attributes including physical attributes (height, width, depth, weight), input/output attributes (keyboard, viewscreen, pointing stick, touchpad), and storage attributes (hard drive, floppy, CD/DVD).

Hence, in the illustrated example of product category for computing devices, various attributes of products are associated with the final subcategory in the conventional catalog taxonomy structure 100 shown. As previously noted, various other categories and subcategories merely provide a catalog taxonomy structure for organizing product information, and do not have any associated attributes in and of themselves.

The disadvantage of the above noted conventional catalog taxonomy structure 100 shown in FIG. 1 is that it requires significant hardware and processing resources due to the repetitive association of the same attributes for numerous final subcategories. As can be seen by careful examination of the attributes associated with the final subcategories in conventional catalog taxonomy structure 100, many attributes are the same for the various final subcategories. For instance, the $2^{nd}$ Tier Category 1 for PDAs, the $2^{nd}$ Tier Category for Servers, the $3^{rd}$ Tier Category for Desktops, and the $3^{rd}$ Tier Category for Notebooks all have physical attributes and input/output attributes associated therewith.

Moreover, such a catalog taxonomy structure further does not allow easy modification of the catalog ontology which is the structure and manner in which the catalog is rendered and displayed to the users of the catalog. For instance, in order to provide another final subcategory, each of the attributes of the products in the final subcategory must be again associated with the final subcategory.

There is no one right way to classify products, and the pitfall of many systems is that they become anchored to one way of classifying products. This presents a dilemma because taxonomy systems that attempt to allow multiple ontologies are often not normalized, not unified, not navigable, or not maintainable. In this regard, some shopping websites have comparable products splintered apart from each other in different nodes of the ontology because they merged disparate ontologies together. For example, in e-commerce sites, consumers can find different models of the same kind of products such as 20 different models handheld TVs. However, these products are not found in the same location in the catalog's ontology. Some of the products may be found in "TVs|Handhelds" category/subcategory, some of the products may be found in "Handheld electronics|TVs" category/subcategory, and some in both.

The present inventors have found that this may occur because the e-commerce sites obtain product data from different data sources that have different taxonomy structures, and the e-commerce sites attempted to merge and map them together, with limited success. The deficiency results from mapping the taxonomies to each other at the node level, having no reference to the attributes, or from mapping and merging taxonomies, one or more of which were not built originally with strict taxonomical inheritance defined.

Therefore, there is an unfulfilled need for a catalog taxonomy structure, system and method that minimizes hardware and processing resources. In addition, there also exists an unfulfilled need for such a catalog taxonomy structure, system and method that allows easy modification of the catalog ontology. Furthermore, there still exists a need for a catalog taxonomy structure, system and method that facilitates attribute based queries to identify products having a particular attribute, and facilitates intelligent merging of multiple taxonomies upon the basis of the associated attributes.

SUMMARY OF THE INVENTION

In view of the foregoing, one aspect of the present invention is a catalog taxonomy organized in a tree-like configuration recorded on media for organizing of product information in a catalog. The catalog taxonomy includes at least one first tier product category having at least one first tier attribute associated with products in the first tier category, and a plurality of second tier product categories branching from one of the first tier product category and defining subcategories of the first tier product category, at least one of the plurality of second tier product categories having at least one second tier attribute associated with products in a subcategory defined by the second tier product categories, wherein each of the second tier product categories inherits the first tier attribute of the first tier product category from which the plurality of second tier product categories branches.

Another aspect of the present invention is a catalog taxonomy for organization of product information in a catalog, the catalog taxonomy comprising a plurality of first tier product categories, at least one of the first tier product categories having at least one first tier attribute corresponding to products in the first tier category, and a plurality of second tier product categories branching from one of the plurality of first tier product categories and defining a subcategory of the first tier product category from which the second tier product category branches, at least one of the second tier product categories having at least one second tier attribute corresponding to products in a subcategory defined by the second tier product category.

Still another aspect of the present invention is a catalog taxonomy for organization of product information in a catalog, the catalog taxonomy comprising a plurality of first tier product categories, at least one first tier product category having at least one first tier attribute associated with products in the first tier category, and a plurality of second tier product categories branching from one of the plurality of first tier product categories, at least one second tier product category having at least one second tier attribute that is associated with products in the at least one second tier product category.

Yet another aspect of the present invention is a catalog taxonomy for organization of product information in a catalog, the catalog taxonomy comprising a plurality of first tier product categories each having a plurality of first tier attributes associated with products in the first tier category, and a plurality of second tier product categories branching from the plurality of first tier product categories, the second tier product categories having a plurality of second tier attributes associated with products in the second tier product categories.

Still another aspect of the present invention is a system for organizing product information in accordance with a catalog taxonomy, the system comprising a processor, an input/output module adapted to allow inputting and outputting of product information associated with a plurality of products, and a database for storing said product information, the database having a catalog taxonomy structure organized in a tree-like configuration.

In accordance with the present invention, the database has a catalog taxonomy structure having at least one first tier product category having at least one first tier attribute associated with products in the first tier category, and a plurality of second tier product categories branching from the first tier product category and defining subcategories of the first tier product category, at least one of the plurality of second tier product categories having at least one second tier attribute associated with products in a subcategory defined by the plurality of second tier product categories. Each of the second tier product categories inherits the first tier attribute of the first tier product category from which the plurality of second tier product categories branches.

In accordance with another aspect of the present invention, a method of organizing a catalog having product information of a plurality of products in a tree-like configuration comprises the steps of providing at least one first tier product category having plurality of products, associating at least one first tier attribute with products in the at least one first tier category, providing a plurality of second tier product categories branching from one of the at least one first tier product category and defining subcategories of the at least one first tier product category, at least one of the plurality of second tier product categories having a plurality of products, associating at least one second tier attribute with products the subcategory defined by the at least one of the plurality of second tier product categories, and each of the second tier product categories inheriting the at least one first tier attribute of the one first tier product category from which the plurality of second tier product categories branches.

These and other aspects of the present invention will become more apparent from the following detailed description of the preferred embodiments of the present invention when viewed in conjunction with the accompanying drawings.

DETAILED DESCRIPTION OF THE PREFERRED EMBODIMENT

Figure 1:
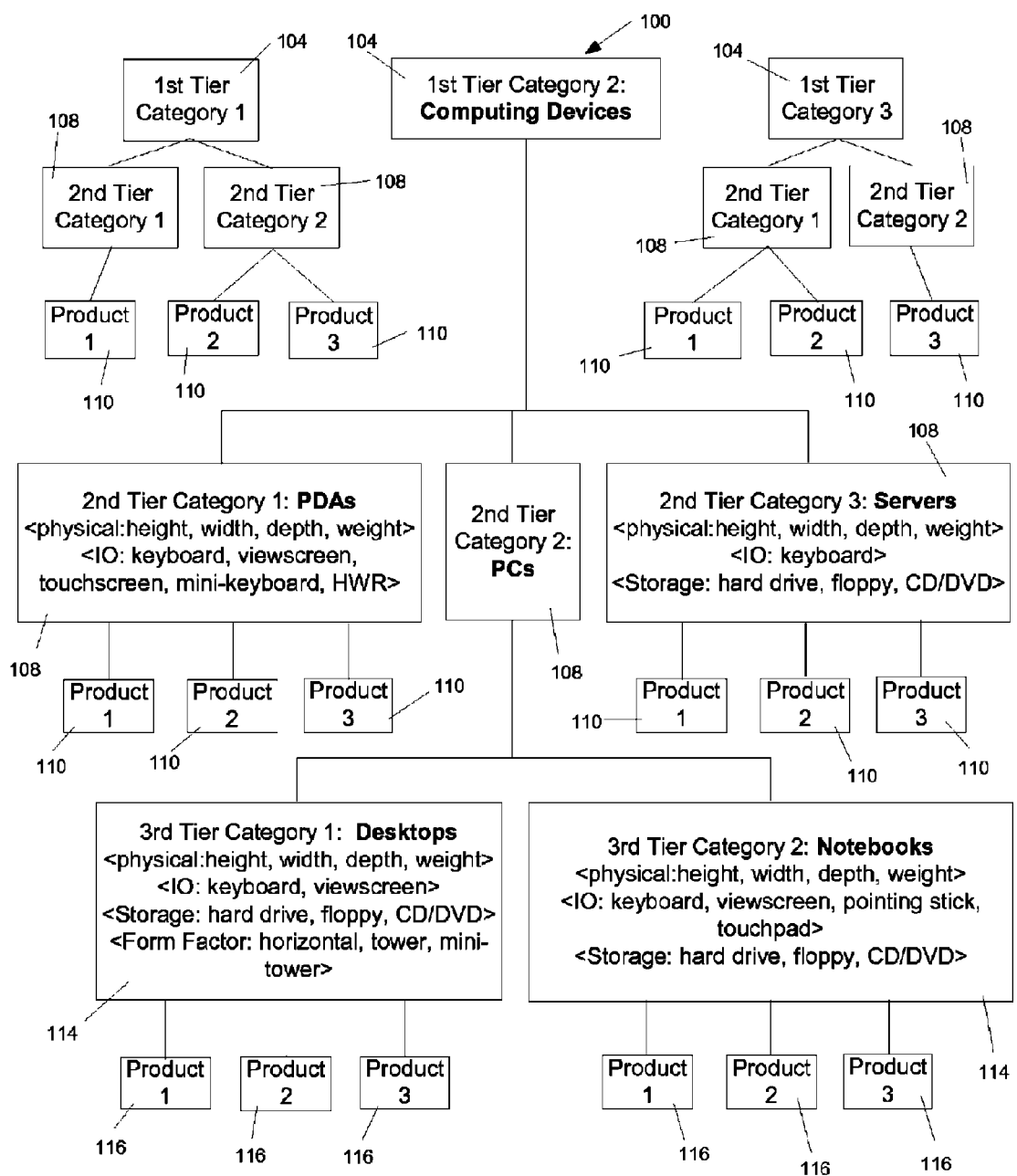
FIG. 1 is a schematic illustration of a conventional catalog taxonomy structure.
Figure 2:
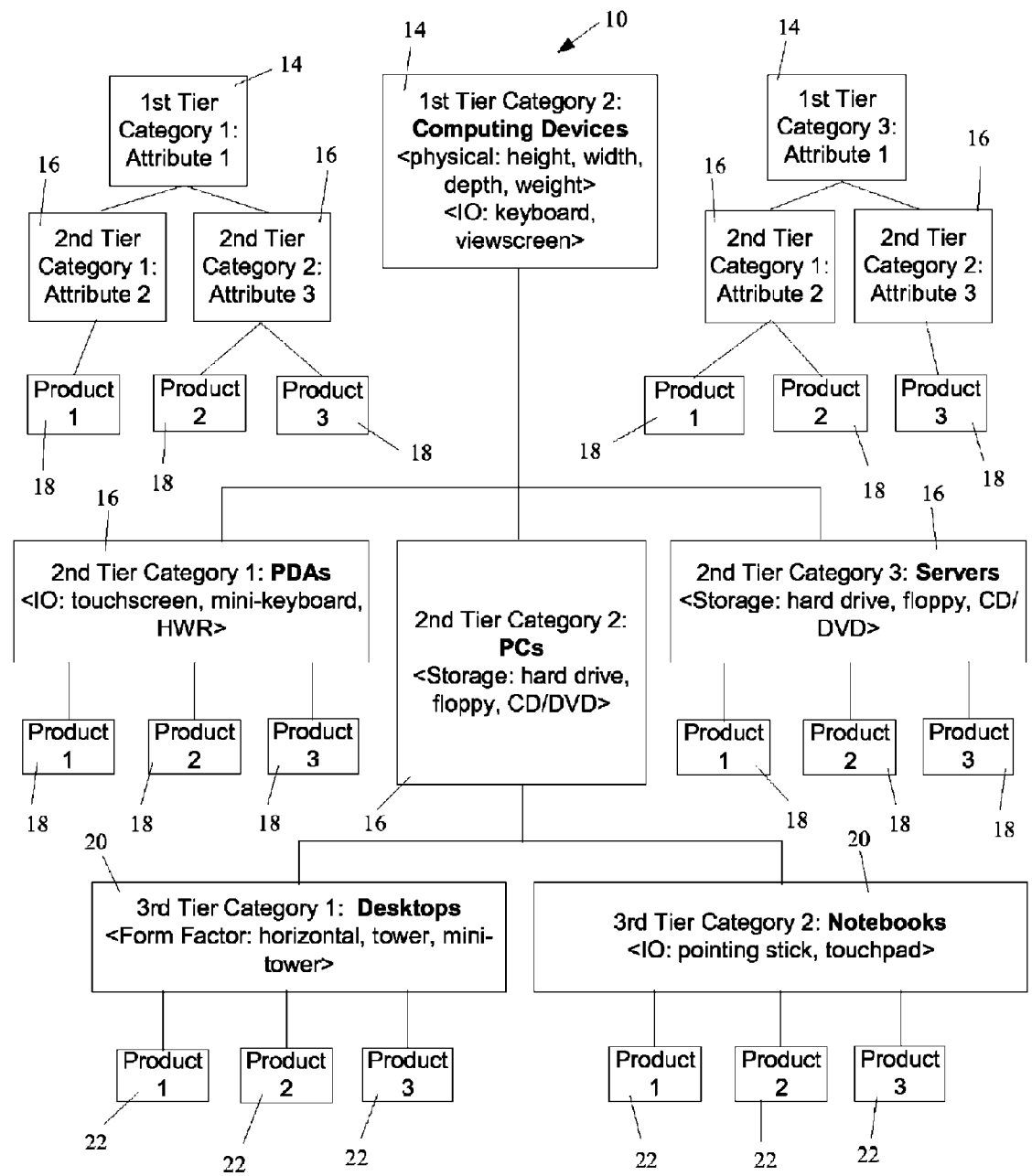
FIG. 2 is a schematic illustration of a catalog taxonomy structure in accordance with one embodiment of the present invention.

FIG. 2 shows a schematic illustration of a catalog taxonomy structure 10 in accordance with one embodiment of the present invention which is shown to generally correspond to the conventional catalog taxonomy structure 100 of FIG. 1 so that the distinctions of the present invention can be fully appreciated.

As can be seen, the catalog taxonomy structure 10 in accordance with the present invention is organized in a tree-like manner with plurality of child product subcategories branching from parent product categories or parent subcategories. It should be readily apparent that the terms "child" and "parent" refer to the relative relationship between product subcategories and/or product categories. In particular, the term "child" refers to product subcategories that branch from another product category or product subcategory, while the term "parent" refers to the product category or product subcategory from which the child product subcategories branch.

It should also be noted that although various implementations described herein below are specifically directed to products and catalogs for categorizing such products, the taxonomy structure in accordance with the present invention is not limited thereto. The taxonomy structure of the present invention may be readily applied in categorizing any type of information such as information related to services. In this regard, the product categories and/or product subcategories are also referred to herein as "nodes" so that child nodes branch from the parent nodes. Moreover, as used herein, the term "attribute" refers to any characteristic of a product or service, or data representing such characteristic.

Referring again to FIG. 2, a plurality of $1^{st}$ Tier Categories 14 are provided in the catalog taxonomy structure 10, each of the plurality of $1^{st}$ Tier Categories 14 having a plurality of $2^{nd}$ Tier categories 16 branching therefrom. The $1^{st}$ Tier Categories 14 may be any appropriate categories of products or services such as Computing Devices for the $1^{st}$ Tier Category 2. The plurality of product $2^{nd}$ Tier Categories 16 branching from the $1^{st}$ Tier Categories 14 may be any appropriate subcategories thereof.

In the illustrated example catalog taxonomy structure 10, various subcategories branching from the $1^{st}$ Tier Category 2 for Computing Devices may include the $2^{nd}$ Tier Category 1 for PDAs, $2^{nd}$ Tier Category 2 for PCs, and $2^{nd}$ Tier Category 3 for Servers. Various products branch from two of the $2^{nd}$ Tier Categories 16. For example, a plurality of products 18 which are various models of PDAs, branch from the $2^{nd}$ Tier Category 1 for PDAs. Similarly, a plurality of products 18 which are various models of Servers branch from the $2^{nd}$ Tier Category 3 for Servers.

In the illustrated embodiment of the catalog taxonomy structure 10, $3^{rd}$ Tier Categories 20 branch from the $2^{nd}$ Tier Category 2 for PCs, the $3^{rd}$ Tier Category 1 being for Desktops, and the $3^{rd}$ Tier Category 2 being for Notebooks. As shown, a plurality of products 22 branch from these $3^{rd}$ Tier Categories, these products being desktops and notebooks in accordance with the subcategories.

In contrast to the commonly used catalog taxonomy structure in which attributes of the products are associated only with the final subcategory, the catalog taxonomy structure 10 of the present invention associates attributes of the products with other categories and subcategories. As shown, the $1^{st}$ Tier Category 2 for Computing Devices (which is not a final category) has associated therewith, physical attributes including height, width, depth, and weight, as well as input/output attributes including keyboard and viewscreen. Moreover, the $2^{nd}$ Tier Category 2 for PCs (which is also not a final category) has associated therewith, storage attributes such as hard drive, floppy, and/or CD/DVD.

Thus, whereas in conventional catalog taxonomy structures, attributes are only associated with the final subcategories so that various parent categories and parent subcategories merely provide an organizational structure for organizing product information, the catalog taxonomy structure in accordance with the present invention associates one or more attributes with parent categories and parent subcategories. The attributes associated with a parent category are generic, and common to all subcategories of the parent category.

Furthermore, in accordance with the catalog taxonomy structure of the present invention, various attributes are associated with the final subcategories as well. For instance, for the $2^{nd}$ Tier Category 1 for PDAs, input/output attributes such as touchscreen, mini-keyboard, and handwriting recognition are associated therewith. Similarly, storage attributes such as hard drive, floppy, CD and/or DVD are also associated with the $2^{nd}$ Tier Category 3 for Servers which is also a final subcategory. Such attributes are unique to the subcategory.

With respect to the $3^{rd}$ Tier Category 1 for Desktops and $3^{rd}$ Tier Category 2 for Notebooks that branch from the $2^{nd}$ Tier Category 2 for PCs, various attributes are associated with these final subcategories as well. As shown, form factor attributes such as horizontal, tower, and mini-tower is associated with the $3^{rd}$ Tier Category 1 for Desktops. The input/output attributes including pointing stick and touchpad are associated with the $3^{rd}$ Tier Category 2 for Notebooks.

It should be evident from comparing the conventional catalog taxonomy structure 100 shown in FIG. 1 with the catalog taxonomy structure 10 of the present invention as shown in FIG. 2, that the final subcategories of the catalog taxonomy structure 10 do not have all the attributes of the final subcategories of the conventional catalog taxonomy structure 100 associated therewith. For example, the $2^{nd}$ Tier Category 1 for PDAs of the catalog taxonomy structure 10 of the present invention is merely provided with the input/output attributes instead of both the input/output attributes and physical attributes as provided in the conventional catalog taxonomy structure 100. In addition, the $2^{nd}$ Tier Category 2 for Servers of the catalog taxonomy structure 10 of the present invention is merely provided with the storage attributes instead of the physical attribute, input/output attribute, and storage attribute as provided in the conventional catalog taxonomy structure 100 shown in FIG. 1.

This aspect of the present invention is more clearly shown in comparison of the $3^{rd}$ Tier Categories. As can be seen, merely the form factor attribute is associated with the $3^{rd}$ Tier Category 1 for Desktops in the catalog taxonomy structure 10, and the physical attributes, input/output attributes, and storage attributes are not associated with the $3^{rd}$ Tier Category 1 like the conventional catalog taxonomy structure 100. Likewise, only the input/output attribute is associated with the $3^{rd}$ Tier Category 2 for Notebooks in the catalog taxonomy structure 10, and the physical attributes and storage attributes are not associated with the $3^{rd}$ Tier Category 1 like the conventional catalog taxonomy structure 100.

Of course, just because the final subcategory is not provided with a particular attribute does not mean that the products properly categorized in the subcategories do not possess these attributes. In this regard, in accordance with the catalog taxonomy structure of the present invention, the common attributes that are associated with the parent category or parent subcategory are inherited by the child subcategory that branches therefrom.

In particular, referring to catalog taxonomy structure 10 of the present invention as shown in FIG. 2, the products 18 that are categorized under the $2^{nd}$ Tier Category 1 for PDAs would not only have associated therewith the input/output attributes of the $2^{nd}$ Tier Category 1, but also have the physical attributes and the input/output attributes that are associated with the $1^{st}$ Tier Category 2 which is the parent category to the $2^{nd}$ Tier Category 1. Likewise, the products 18 that are categorized under the $2^{nd}$ Tier Category 3 for servers would not only have the storage attributes of the $2^{nd}$ Tier Category 3, but also have the physical attributes and the input/output attributes that are associated with the $1^{st}$ Tier Category 2 as well.

Similarly, the products 22 that are categorized under the 3$^{rd}$ Tier Category 1 for Desktops would not only have the form factor attributes associated therewith, but would also have the storage attribute associated with the parent subcategory 2$^{nd}$ Tier Category 2, as well as the physical attributes and the input/output attributes that are associated with the 1$^{st}$ Tier Category 2, which is the parent category to the subcategory 2$^{nd}$ Tier Category 2. Furthermore, the products 22 that are categorized under the 3$^{rd}$ Tier Category 2 for Notebooks would not only have the storage attributes of the 2$^{nd}$ Tier Category 2, but would also have the physical attributes and the input/output attributes that are associated with the 1$^{st}$ Tier Category 2.

Thus, the catalog taxonomy structure 10 in accordance with the present invention allows the child nodes to inherit attributes associated with the parent nodes from which the child nodes branch. Attribute inheritance in accordance with the present invention provides a mechanism for automatically communicating attributes of a category/subcategory to another subcategory, i.e. from a parent node to a child node. Another way to look at this embodiment is to consider the attribute as being pushed "up" the tree as far as possible for attributes that are common to all subcategories.

The described attribute inheritance and association of attributes to categories and/or subcategories may be attained in any appropriate manner. In accordance with one implementation of the present invention, attribute inheritance and association of attributes may be attained by creating attribute groups and mapping the attribute groups to various parent nodes and/or child nodes, i.e. categories. An attribute group is a collection of attributes that are functionally similar to each other. For example, relative to computing devices of FIGS. 1 and 2, physical attributes of height, width, depth, weight constitutes an attribute group, this group being delineated with brackets "< >". Thus, input/output attributes of keyboard, viewscreen, touchscreen, mini-keyboard, handwriting recognition, pointing stick, and touchpad also form are attribute groups.

In accordance with the catalog taxonomy structure 10 of the embodiment, attribute groups may be associated with a category/subcategory by mapping the attribute groups to the desired node, whether the node is a category or a subcategory. Alternatively, the attribute group or one or more attributes of the group may be inherited from the parent of the subcategory as noted above. Thus, in the illustrated example catalog taxonomy structure 10 of FIG. 2, a physical attribute group and an input/output attribute group are mapped to the 1$^{st}$ Tier Category 2 for Computing Devices. Also, an input/output attribute group is mapped to the 2$^{nd}$ Tier Category 1 for PDAs, a storage attribute group is mapped to the 2$^{nd}$ Tier Category 2 for PCs, and storage attribute group is mapped to the 2$^{nd}$ Tier Category 3 for Servers. Lastly, the form factor attribute group is mapped to the 3$^{rd}$ Tier Category 1 for Desktops, and the input/output attribute group is mapped to the 3$^{rd}$ Tier Category 2 for Notebooks.

In accordance with the embodiment, the 2$^{nd}$ Tier Category for PDAs inherits the physical attribute group from the 1$^{st}$ Tier Category 2 with all the attributes including height, width, depth, and weight. As shown, the input/output attribute groups are mapped to both the 1$^{st}$ Tier Category 2 for Computing Devices as well as the 2$^{nd}$ Tier Category 1 for PDAs. However, the attributes of the input/output attribute group mapped to the 2$^{nd}$ Tier Category 1 differs from the attributes of the attribute group mapped to the 1$^{st}$ Tier Category 2. In particular, attributes of the input/output attribute group mapped to the 2$^{nd}$ Tier Category 1 includes touchscreen, mini-keyboard, and handwriting recognition, whereas the attributes of the input/output attribute group mapped to the 1$^{st}$ Tier Category 2 includes keyboard and viewscreen.

When attribute groups of the same name are provided in both a child node and a parent node, the catalog taxonomy structure of the present invention merges the attribute groups of the child node with the attribute groups of the parent so that the child node inherits the attributes of the attribute group of the parent which the attribute group of the child node is missing. Thus, referring again to the 2$^{nd}$ Tier Category 1 for PDAs, because the input/output attribute group names are the same, the input/output attribute groups are merged together so that the input/output attribute group mapped to the 2$^{nd}$ Tier Category 1 for PDAs inherits the attributes of keyboard and viewscreen from the input/output attribute group mapped to the 1$^{st}$ Tier Category 2.

If for some reason, the same attributes are provided in the attribute groups of the parent node as well as the child node having the same attribute group name, the attribute of the parent node is not inherited by the child node so that redundant attributes are not created in the attribute group of the child node. Such mapping and merging of attribute groups may be attained in any appropriate manner, and will be readily attainable in view of the disclosure herein, including mapping and merging techniques that are known in the art, and need not be described in detail.

Correspondingly, referring again to FIG. 2, the 2$^{nd}$ Tier Category 3 for Servers inherits the physical attribute group and the input/output attribute group from the 1$^{st}$ Tier Category 2. No merging is required since attribute groups of the same name are not present. Likewise, the 3$^{rd}$ Tier Category 1 for Desktops inherits the storage attribute group from the 2$^{nd}$ Tier Category 2 for PCs, and further inherits the physical attribute group and the input/output attribute group from the 1$^{st}$ Tier Category 2. Again merging is not required since attribute groups of the same name are not present.

Lastly, the 3$^{rd}$ Tier Category 2 for Notebooks which has the input/output attribute group mapped thereto, inherits the storage attribute group from 2$^{nd}$ Tier Category 2 for PCs, and inherits the physical attribute group from the 1$^{st}$ Tier Category 2. Furthermore, the input/output attribute group mapped to the 3$^{rd}$ Tier Category 2 for Notebooks is merged with the same attribute group of the 1$^{st}$ Tier Category 2 so that it inherits the attributes for keyboard and viewscreen.

Of course, it should be understood that the above discussed embodiment of the catalog taxonomy structure 10 in accordance with the present invention is merely one example implementation thereof. The details regarding the products and the associated attributes are provided to facilitate understanding of the present invention. In this regard, it should also be understood that the terms 1$^{st}$ tier, 2$^{nd}$ tier, and 3$^{rd}$ tier categories are relative terms used to illustrate the relative relationship between the categories and do not refer to the actual category tiers of a catalog taxonomy structure. Thus, the 1$^{st}$ tier category as referred to herein, may be a 4$^{th}$ tier category in the actual catalog taxonomy to which the present invention is applied, the 2$^{nd}$ tier category actually a 5$^{th}$ tier category, and so forth. Stated in another manner, the present invention is equally applicable to catalog taxonomy structure in which products in a 5$^{th}$ tier category inherits attributes from a 4$^{th}$ tier category which in turn, inherits attributes from a 3$^{rd}$ tier category, etc.

In accordance with another aspect of the present invention, each of the attributes in an attribute group may have a scalar index value which can be used in emphasizing or deemphasizing relative importance of the each of the attributes. These scalar index values of each of the attributes may be used in ranking products of a given subcategory of products. In particular, various methods for ranking products of a category are known and implemented on a distributed network such as the Internet to facilitate purchase decisions of consumers. Typically, such methods rank products based on several primary attributes that define the category of products. For example, some primary attributes of notebook computers may include weight, viewscreen size, hard drive memory, and processor speed, etc.

Methods of ranking products generally convert these primary attributes into scalar values and derive attribute ranks for each of the products of the product category. The primary attribute ranks indicate the rank of each product relative to the other products in the product category based on each of the attributes, and may be determined in any appropriate manner. For example, the conventional method of percentile ranks may be used to obtain the primary attribute ranks. Of course, more sophisticated methods may be used to determine the primary attribute ranks instead.

By mathematically processing the attribute ranks, a final ranking of the products may be determined which takes into consideration each of the primary attributes by weighing each of the various attribute ranks to allow ranking of the products in a given category/subcategory. The scalar index values of each of the attributes may be used to weigh each of the various attribute ranks.

In particular, referring again to the example of notebook computers, the scalar index values for the primary attributes of notebook computers may be as follows: weight (0.25), viewscreen size (0.25), hard drive memory (0.25), and processor speed (0.25). As previously noted, these scalar index values may be used in conjunction with the determined attribute ranks to allow determination of the final ranking of the products. For example, each of the scalar index values may be multiplied together with the attribute ranks and each of the products added together. The final sum provides a ranking of each of the products based on the attributes of each product while weighing the importance of each of the attributes appropriately. Of course, the above described method of ranking products is merely provided as one example and other methods that utilize different process steps may be used in other implementations.

In view of the above, the catalog taxonomy structure 10 as shown in FIG. 2 may be further adapted to allow inheritance of the scalar index values for each of the attributes in an attribute group. When a conventional catalog taxonomy is utilized, modification of such scalar index values is not required since the attributes with scalar index values are all associated with the final subcategory. However, modification of such scalar index values are desirable when the catalog taxonomy structure of the present invention is utilized because various attributes are associated with parent product categories/subcategories which can result in unintended weighing of the various attributes.

Referring again to the above example, whereas weight is a very important attribute for notebooks due to their portability, the weight attribute is relatively unimportant for desktops computers. Thus, if the catalog taxonomy structure 10 of the present invention as shown in FIG. 2 is utilized, an inappropriate scalar index value for the attribute of weight will be inherited by the $3^{rd}$ Tier Category 1 for Desktops from the physical attribute group mapped to the $1^{st}$ Tier Category 2. Correspondingly, in the preferred embodiment, the catalog taxonomy structure 10 is further adapted to allow editing and/or modification of the scalar index value for weight of the product, for example, from scalar index value of 0.25 to scalar index value of 0.01 for desktops.

The above described editing of scalar index values may be attained in any appropriate manner. In one implementation, such editing of scalar index values may be attained by providing a child node with a filter, the filter providing instructions for editing a scalar index value of a particular attribute as the attribute is inherited from a parent node. Preferably, filter should be additive meaning that scalar index values are edited by each of the filters of the parent nodes as it is inherited by the child node. In other words, the scalar index value is modified each time by each of the filters as the attribute is inherited.

The above described catalog taxonomy structure in accordance with the present invention minimizes the computational resources needed since only certain attributes and/or attribute groups are associated with the parent categories and parent/child subcategories. As described, the remaining attributes and/or attribute groups of the child subcategories are inherited from the parent category/subcategory. The inheritance feature of the catalog taxonomy structure further allows the ontology of the catalog to be readily modified or reconfigured so that the products are grouped together in any desired manner. For example, in accordance with one implementation, grouping of the products may be attained by implementing rules which allows selection of products from the catalog taxonomy structure based on various desired attributes. Such rules can be used to group the products in any desired manner to provide the desired catalog ontology as explained by way of examples below.

Figure 3A:
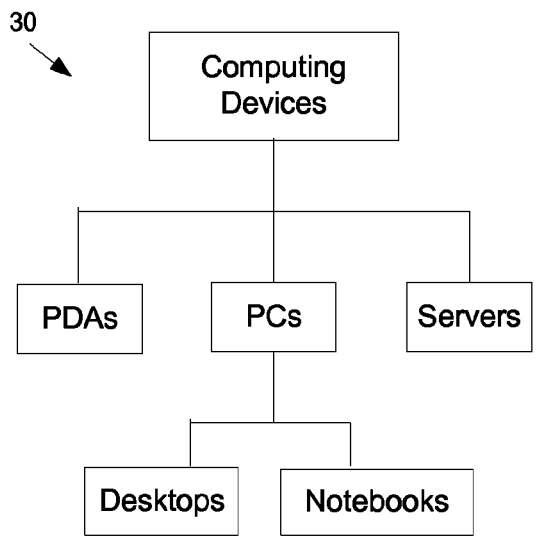
FIG. 3A is a schematic illustration of an example catalog ontology derived from the catalog taxonomy structure of FIG. 2.

For example, the catalog taxonomy structure 10 of FIG. 2 may be utilized in substantially unmodified form to provide a catalog ontology that substantially mimics the catalog taxonomy structure. Catalog ontology 30 of FIG. 3 shows such an ontology in which PDAs, PCs, and Enterprise Servers are subcategories of Computing Devices. The shown catalog ontology 30 of FIG. 3 may be a navigable catalog of a merchant via the Internet, for example, to allow consumers to view information, and purchase desired products.

The catalog taxonomy structure in accordance with the preferred embodiment of the present invention is further adapted to allow regrouping of products under new subcategories, or to generate a new derivative subcategory based on products of already existing subcategories. In particular, a rule may be used to generate a new derivative subcategory of products in the catalog ontology 30 of FIG. 3A called "Mobile Computing Devices".

The rule may be attribute-based queries so that rapid tree-based search can be performed rather than an exhaustive index-based search of all the products stored in a database of the catalog. More specifically, a search of the taxonomy nodes can be conducted to determine which nodes have the attribute being searched, thereby immediately allowing grouping of these nodes in a new category or a derivative category. Thus, the organization of product information in accordance with the catalog taxonomy structure of the present invention allows extremely efficient searching. In contrast, conventional catalog taxonomy structures would require searching of thousands of product records, and then clustering them by categories.

Figure 3B:
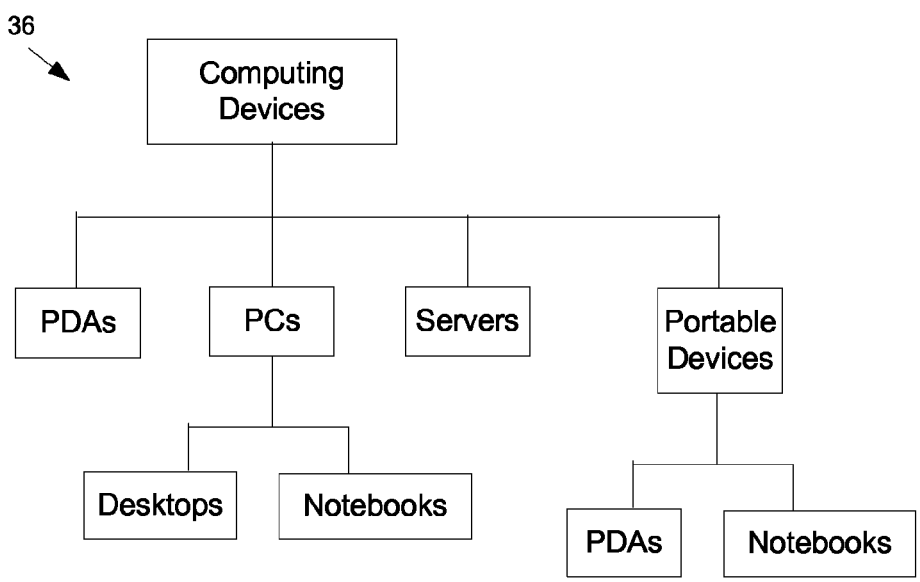
FIG. 3B is a schematic illustration of the catalog ontology of FIG. 3A in modified form.

An example of a new derivative subcategory is schematically illustrated in the modified catalog ontology 36 of FIG. 3B. The new subcategory of Ultra-Mobile Computing Devices may be comprised of both PDA's as well as the smallest sub-notebooks, so as to allow comparison of such products in a side-by-side manner thereby providing alternative portable products for the consumer. Preferably, such a rule would also cause the merging of any commonly named attribute groups. In particular, referring again to the catalog taxonomy structure 10 of the present invention, the input/output attribute groups for PDAs and Notebooks would be merged together for the new derivative subcategory of "Ultra-Mobile Computing Devices," resulting in input/output attribute group having attributes of keyboard, viewscreen, touchscreen, mini-keyboard, handwriting recognition, pointing stick, and touchpad.

Of course, the derivative subcategory of Ultra-Mobile Computing Devices may be further restricted to have certain attributes so that only selected Notebooks and PDAs populate the newly created subcategory in the catalog ontology. For example, the attribute of weight may be limited so that only devices under 2.5 pounds are selected to be included in the Ultra-Mobile Computing Devices subcategory.

The above described use of rules would enable, for example, a catalog to generate the following output with a product comparison table in response to a consumer's query:

| Model | Physical Characteristics | Input/Output: |
|---|---|---|
| Palm VIIx | 4.2" × 3.1" × 0.4" | Viewscreen, TouchScreen, HWR |
| Nokia 9020 | 6.8" × 2.4" × 1.3" | Viewscreen, Mini-Keyboard |
| Fujitsu Lifebook P-2000 | 10.5" × 7.3" × 2.1" | Viewscreen, Keyboard, Pointing Stick |

Of course, the product comparison table of the generated output shown above merely sets forth two attributes of such devices, as an example only. Moreover, it should be noted that some embedded display logic may be provided for the input/output attribute group to actually only display the specific attributes of the attribute group that is possessed by the particular product. For instance, as shown in the product comparison table, the display logic may display a particular attribute if the product has a True value for that particular attribute, and not display a particular attribute if the product has a False value for the particular attribute.

Furthermore, in accordance with another aspect of the present invention, the above described catalog taxonomy structure where attributes are inherited from parent nodes provides a distinct advantage as compared to conventional catalog taxonomy structures. In particular, the catalog taxonomy structure of the present invention is independent of the ontologies for catalogs. This facilitates generation of different ontologies for catalogs using rules that specify particular attributes, each ontology being tailored to a specific demographic or market, for example. In other words, the catalog taxonomy structure 10 in accordance with the present invention allows quick and easy modification of the ontological arrangement of products in various desirable manner as described below.

Figure 4:
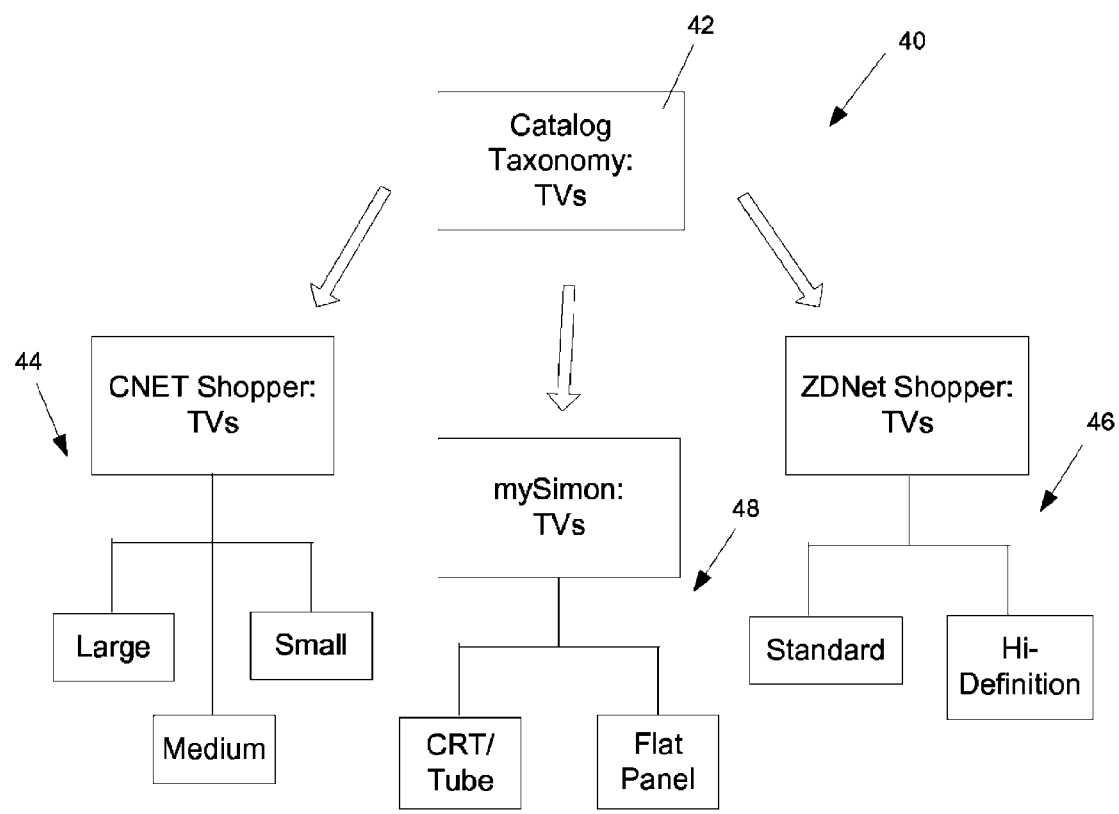
FIG. 4 is a schematic illustration of various catalog ontologies for televisions derived from the same catalog taxonomy in accordance with another embodiment.

For example, FIG. 4 shows a high level schematic illustration 40 of various catalog ontologies 44, 46, and 48, that may be derived from a common catalog taxonomy 42 for televisions, each of the derived catalog ontologies being structured differently from each other to provide different user navigation. In particular, online catalog of CNET Shopper may use the catalog taxonomy 42 to generate a catalog ontology 44 in which TVs are categorized by their size, i.e. Large, Medium, and Small. Alternatively, the online catalog of ZDNet Shopper may use the catalog taxonomy 42 to generate a catalog ontology 46 in which TVs are categorized by the quality of reception and resolution, for example, standard or Hi-Definition. In still another alternative, the on-line catalog of mySimon may use the catalog taxonomy 42 to generate a catalog ontology 48 in which TVs are categorized by the screen type, i.e. cathode ray tube or flat-panel. Of course, these are merely example catalog ontologies and other ontologies may be generated as well.

Figure 5:
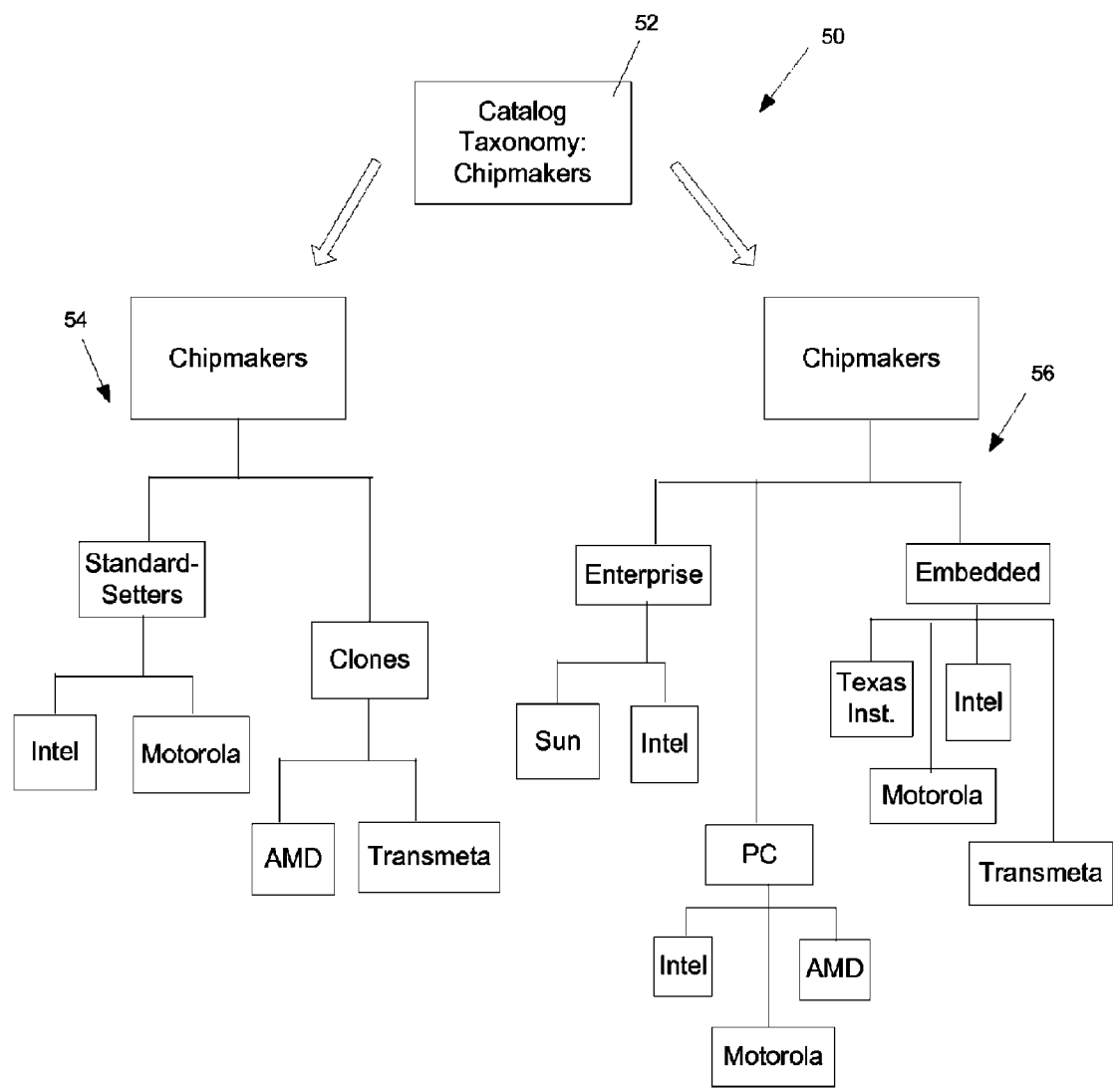
FIG. 5 is a schematic illustration of various catalog ontologies for computer chipmakers derived from the same catalog taxonomy in accordance with yet another embodiment.

It should be noted that whereas the above examples have focused on consumer products, the catalog taxonomy structure in accordance with the present invention may be readily applied to any type of categorized information. For example, FIG. 5 shows a high level schematic illustration 50 of various catalog ontologies that may be derived for classifying computer chipmakers from a common catalog taxonomy 52. In the illustrated example, the catalog taxonomy 52 may be used to derive a catalog ontology 54 that categorizes computer chipmakers based on their market recognition such as "Standard-Setters" which may include Intel and Motorola, and "Clones" which may include AMD and Transmeta.

The same catalog taxonomy 52 may be used to derive a catalog ontology 56 for categorizing chipmakers based on common application of the products such as "Enterprise" for servers, "Personal Computers", and "Embedded" processors. Thus, chipmakers Sun Microsystems and Intel may be categorized under Enterprise, whereas chipmakers Intel, Motorola, and AMD may be categorized under Personal Computers. Moreover, chipmakers from Texas Instruments, Intel, Motorola, and Transmeta, may be categorized under for Embedded Processors.

It should be noted that the chipmaker Intel is categorized under all three of the subcategories in the catalog ontology 56 while the chipmaker Motorola is categorized under two of the subcategories. The various ontological arrangements as well as multiple categorization of a chipmaker is facilitated by the catalog taxonomy structure of the present invention which allows child nodes to inherit attributes associated with corresponding parent nodes.

Figure 6:
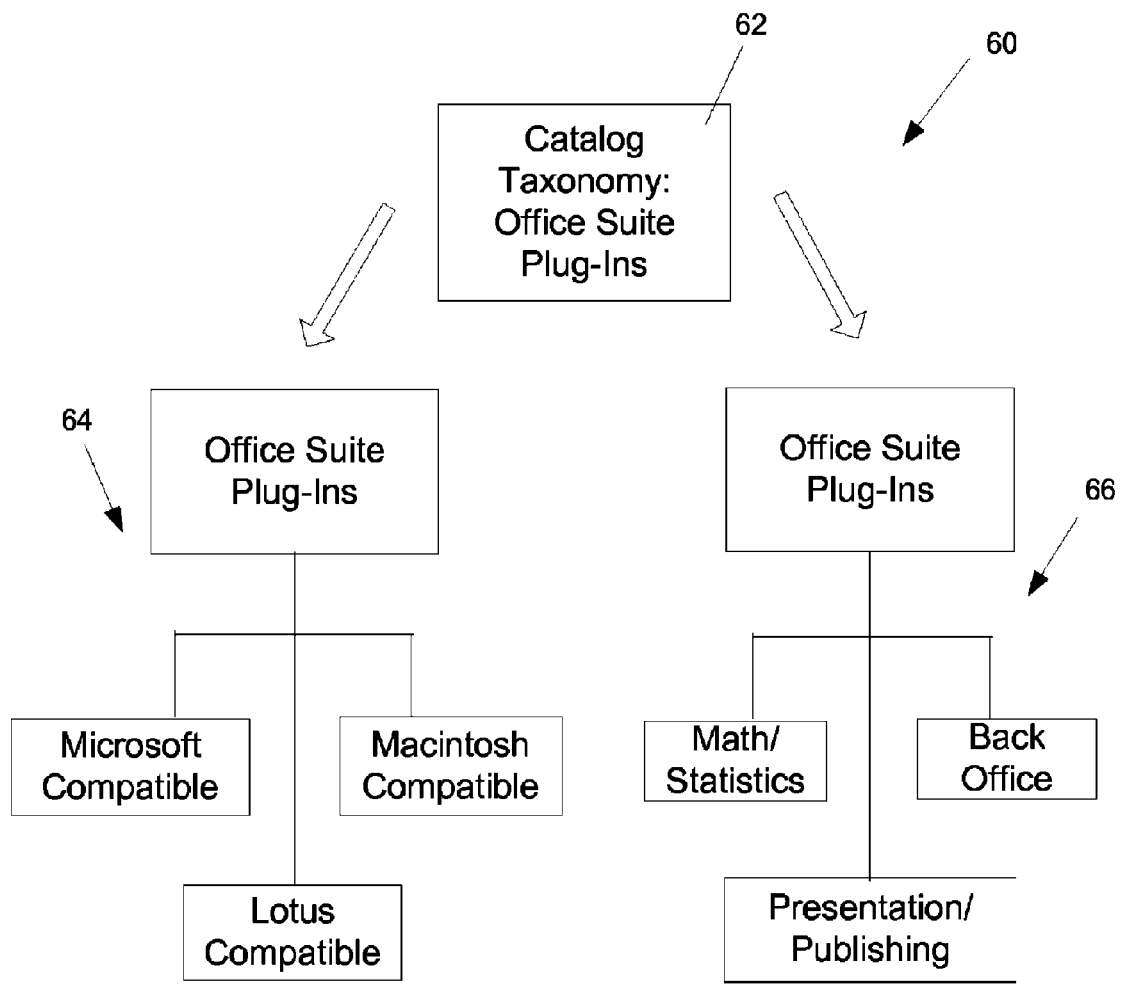
FIG. 6 is a schematic illustration of various catalog ontologies for software plug-ins derived from the same catalog taxonomy in accordance with still another embodiment.

As another example, FIG. 6 shows a high level schematic illustration 60 of various catalog ontologies that may be derived from a common catalog taxonomy 62 for software plug-ins for office suite software. In this example, the catalog taxonomy 62 may be used to derive a catalog ontology 64 in which the plug-ins are categorized based on their compatibility, i.e. whether the plug-ins are compatible with Microsoft, Lotus, or Macintosh products. Alternatively, the catalog taxonomy 62 may be used to derive a catalog ontology 66 in which the plug-ins are categorized based on their function, i.e. whether the plug-ins are for use in conjunction with software for mathematical/statistical analysis, presentation/publishing, or back-office management.

In addition, it should also be noted that the catalog taxonomy of the present invention may be used by a vendor of products or the like to propose products that are related to a particular sub-category of products. Such related products may include accessories or components in systems that are configurable and/or used with products sharing common or related attributes. For example, a sub-category for PDAs that are configured with a Bluetooth port may be related to other products that also have Bluetooth ports so that these other products may be proposed by the vendor. This would also facilitate substantially automated generation of product bundles or packages, or help in the recognition and organization of product bundles in the offerings, listings, and data feeds of various vendors, merchants, manufacturers, etc.

Furthermore, the catalog taxonomy in accordance with the present invention may be utilized to facilitate management of "harvesting" jobs where data feeds or web-crawled (screen scraped) data and/or text content is organized around the catalog taxonomy, and to facilitate merging multiple overlapping sources. Because the catalog taxonomy of the present invention is provided with hierarchical attributes that are inheritable, the data and/or text content that is harvested can be propagated downward in the tree to the deepest node that is appropriate. This is applicable to any kind of content where the attributes (or their synonymous terms that may be provided, for example, in an alias table) are found, and may be content that is indirectly related to products and not just the products themselves. For example, the content may be descriptions, editorials, reviews, user opinions, forum threads, press releases, software updates and downloads, rebates, recall notices, etc.

The catalog taxonomy in accordance with the present invention may further be used in conjunction with another partner-system that provides a similar organizational structure for such content, and even non-catalog and non-editorial content. Such partner-system may be adapted to catalog any content that can be described as fitting into, or being attached to, a similar hierarchy of well-defined attributes which are inheritable in the manner previously described. The content may also include non-product data such as metadata that is used in helping to manage program structures or states of such non-product entities. For example, the non-product metadata may be a periodical, author, date of a review or opinion or lab test of a product, the statistical percentage of users that praise or condemn the excellence or deficiency of a certain product in respect of one of its attributes, the expiration date of a rebate offer, and the URL addresses where the rebate form can be found, etc.

The catalog taxonomy of the present invention allows these associated groups of attributes to "ride along" with their appropriate content in the partner-system, and be mapped to the product attributes of the catalog taxonomy which are the basis of how the content is "harvested". In other words, the partner-system may provide a similar organizational structure for peripherally related content and the nodes of the partner-system may be mapped to the nodes of the catalog taxonomy structure to thereby provide easy access to, and generation of, peripheral information regarding products and/or sub-categories of the catalog taxonomy. For example, peripheral information regarding sales and rebates that are available for 4-megapixel cameras in the market, and other data such as expiration dates for the sales/rebates may be generated for the user. Of course, the above discussion merely provides example benefits that may be realized by utilizing the catalog taxonomy of the present invention, and other benefits may be realized in other implementations.

Figure 7:
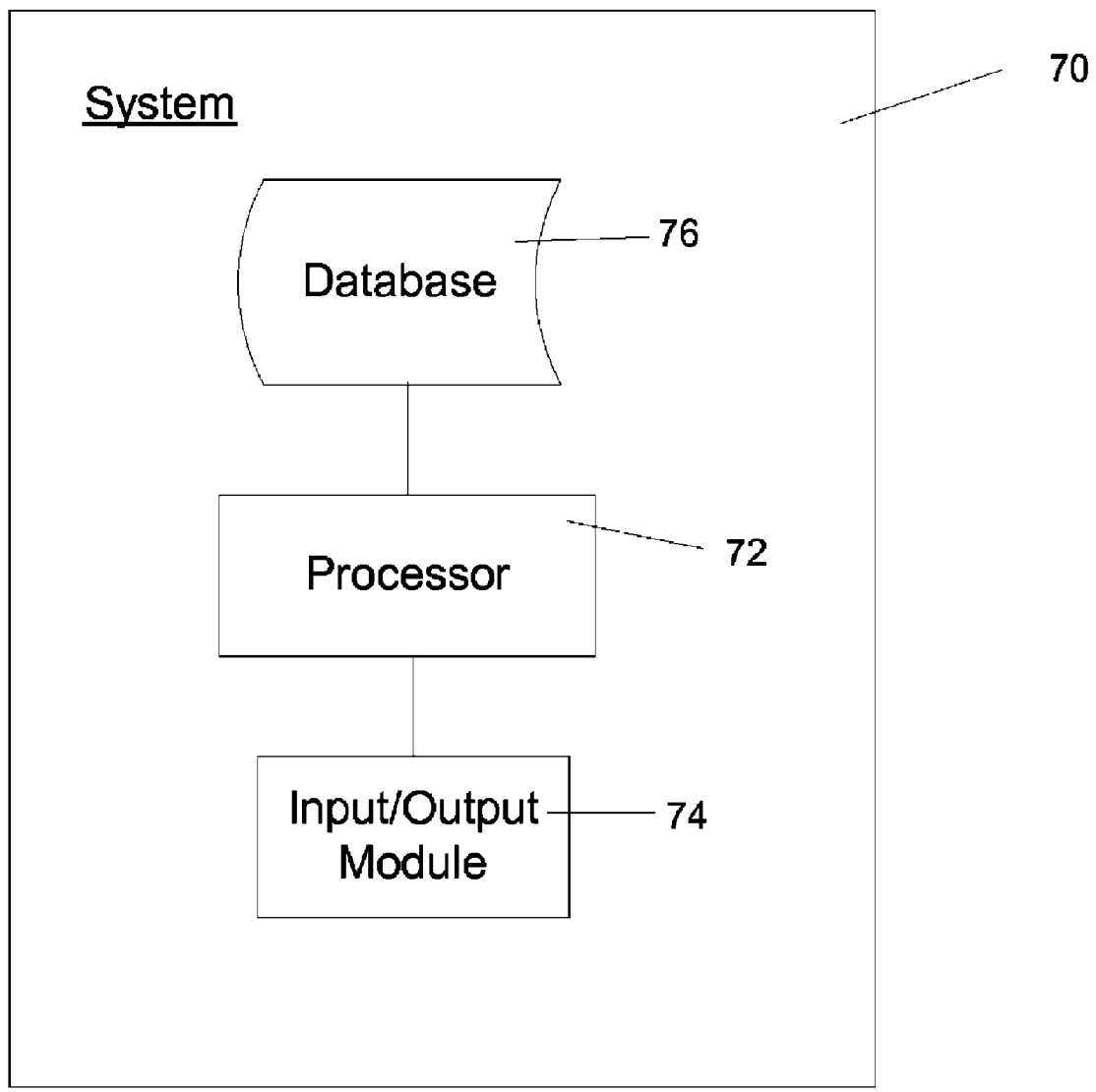
FIG. 7 is a schematic illustration of a system for organizing product information in accordance with a catalog taxonomy.

FIG. 7 is a schematic illustration of a system 70 for organizing product information in accordance with a catalog taxonomy described above. In the illustrated implementation, the system 70 for organizing product information includes a processor 72, an input/output module 74, and a database 76 for storing said product information.

The system 70 of FIG. 7 may be implemented with any type of hardware and software, and may be a pre-programmed general purpose computing device. For example, the system 70 may be implemented using a server, a personal computer, a portable computer, a thin client, or any other appropriate device, or any combination of such devices. In addition, whereas the system 70 of the illustrated embodiment is shown as a single device, at a single location, it may also be multiple devices at a single, or multiple, locations that are connected together using any appropriate communication protocols over any communication medium such as electric cable, fiber optic cable, any other cable, or in a wireless manner using radio frequency, infrared, or other technologies.

The processor 72 of the system 70 is connected to the input/output module 74 and the database 76 and may be any appropriate computational processor. The input/output module 74 may include any input device or devices appropriate for allowing inputting of product information associated with a plurality of products such as a keyboard, mouse, etc., and may also include data links, modems, memory devices, etc. to allow rapid inputting of product information and data into the system 70. In addition, the input/output module 74 may also include output device or devices for outputting product information. Such output devices may include monitors, printers, memory devices, etc. The details of such devices are well known in the art and hence, discussion thereof are omitted herein.

The database 76 of the system 10 for organizing product information has a catalog taxonomy structure organized in a tree-like configuration as described above relative to FIG. 2. In particular, in accordance with the present invention, the database 76 has a catalog taxonomy structure having at least one first tier product category having at least one first tier attribute associated with products in the first tier category, and a plurality of second tier product categories branching from the first tier product category and defining subcategories of the first tier product category, at least one of the plurality of second tier product categories having at least one second tier attribute associated with products in a subcategory defined by the plurality of second tier product categories. In the manner previously described, each of the second tier product categories inherits the first tier attribute of the first tier product category from which the plurality of second tier product categories branches. The structure of the catalog taxonomy provided in the database 76 should be evident from the discussion above relative to FIG. 2. Thus, further discussion is omitted herein to avoid repetition.

Figure 8:
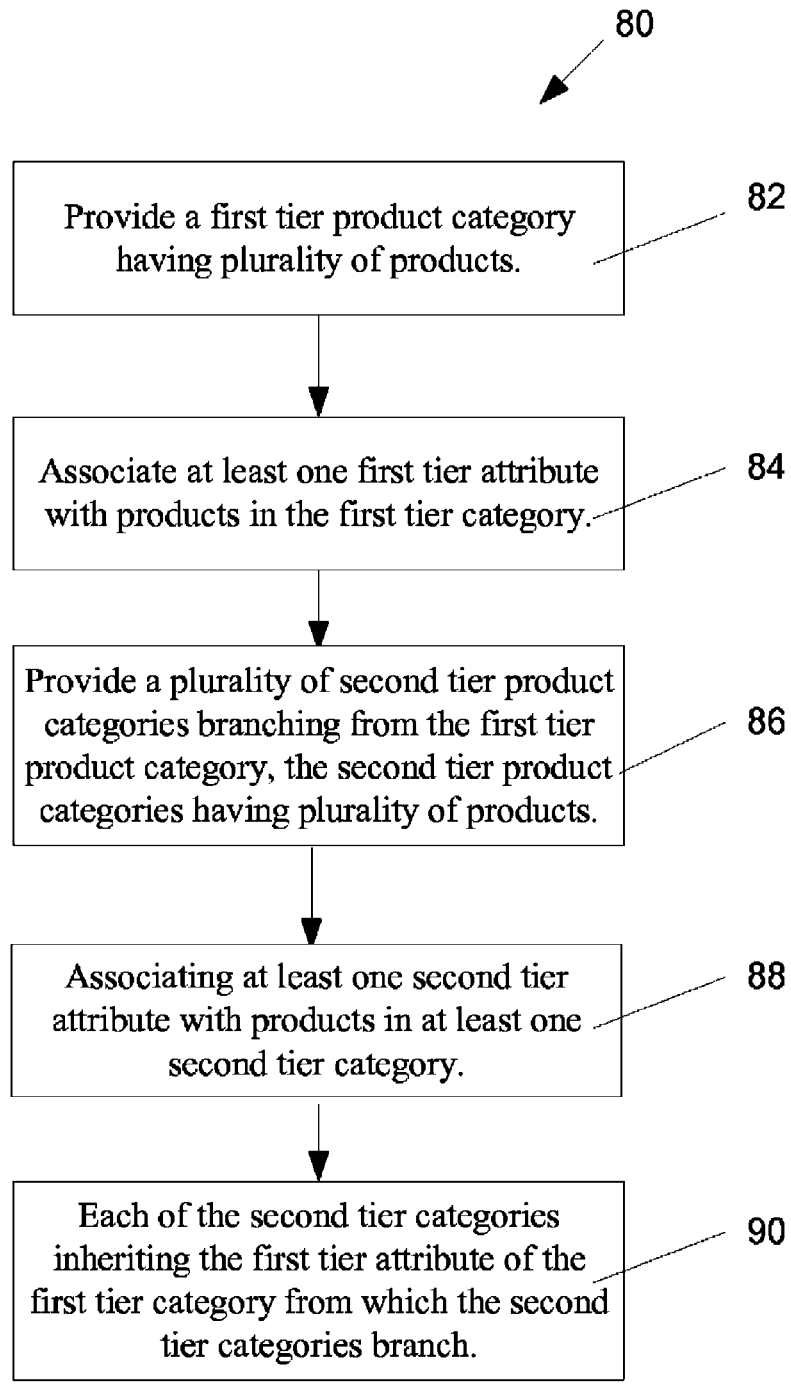
FIG. 8 is a schematic illustration of a method of organizing a catalog having product information of a plurality of products.

FIG. 8 shows a flow diagram 80 that schematically illustrates a method of organizing a catalog having product information of a plurality of products in accordance with another aspect of the present invention. As shown in the flow diagram 80, the method includes step 82 in which at least one first tier product category is provided, the first tier category having plurality of products. In step 84, at least one first tier attribute is associated with products in the first tier category.

A plurality of second tier product categories branching from the first tier product category is provided in step 86, the second tier product categories defining subcategories of the first tier product category and having a plurality of products. At least one second tier attribute is associated with products of the subcategory defined by at least one of the plurality of second tier product categories in step 88. Finally, in step 90, each of the second tier product categories inherit the first tier attribute of the first tier product category from which the plurality of second tier product categories branches. Of course, it should be understood that the method as set forth in the flow diagram 80 is merely one example method of organizing a catalog having product information of a plurality of products in accordance with the present invention.

It should now be evident how the catalog taxonomy structure, system and method of the present invention minimize processing requirements while facilitating generation of alternative catalog ontologies as compared to conventional catalog taxonomies of the prior art. It should also be apparent to one of ordinary skill in the art that the present invention may also be effectively applied for categorizing any type of products, services, and/or information.

While various embodiments in accordance with the present invention have been shown and described, it is understood that the invention is not limited thereto. The present invention may be changed, modified and further applied by those skilled in the art. Therefore, this invention is not limited to the detail shown and described previously, but also includes all such changes and modifications.

We claim:

1. A system for organizing information records in an ontology based on a query, the system comprising:
   one or more processors; and
   one or more memories operatively coupled to at least one of the one or more processors and having instructions stored thereon that, when executed by at least one of the one or more processors, cause at least one of the one or more processors to:
      receive a query, wherein the query specifies an attribute condition;
      search a taxonomy of information records for any information records which satisfy the attribute condition, wherein the taxonomy is organized in a hierarchical structure comprising one or more tiered categories with the information records in the taxonomy inheriting any attributes associated with their corresponding tiered category and any higher tiered categories above their corresponding tiered category and wherein information records in the taxonomy are stored as nodes which are also represented in an ontology, the ontology being organized in categories and subcategories which are independent of the structure of the taxonomy;
      identify a plurality of result information records in the taxonomy which satisfy the attribute condition;
      generate a new category in the ontology; and
      populate the new category in the ontology with a plurality of result nodes corresponding to the plurality of result information records.

2. The system of claim 1, wherein the new category is a new subcategory of an existing category in the ontology.

3. The system of claim 1, wherein at least one of the one or more memories has further instructions stored thereon that, when executed by at least one of the one or more processors, cause at least one of the one or more processors to:
   identify a first attribute group associated with a first node in the plurality of result nodes;
   identify a second attribute group associated with a second node in the plurality of result nodes;
   determine one or more result attributes which are common to the first attribute group and the second attribute group; and
   associate the one or more result attributes with the new category in the ontology.

4. The system of claim 1, wherein the information records are product information records, the one or more tiered categories comprise a plurality of tiered categories, and an attribute associated with a first tier category is associated with all the product information records in the first tier category and inherited by any product information records in a second tier category below the first tier category.

5. The system of claim 1, wherein the attribute condition specifies existence of one or more attributes.

6. The system of claim 1, wherein the attribute condition specifies a value range of one or more attributes.

7. A method for organizing information records in an ontology based on a query by one or more computing devices, the method comprising,
   receiving, by at least one of the one or more computing devices, a query, wherein the query specifies an attribute condition;
   searching, by at least one of the one or more computing devices, a taxonomy of information records for any information records which satisfy the attribute condition, wherein the taxonomy is organized in a hierarchical structure comprising one or more tiered categories with the information records in the taxonomy inheriting any attributes associated with their tiered category and any higher tiered categories above their tiered category and wherein the information records in the taxonomy are stored as nodes which are also represented in an ontology, the ontology being organized in categories and subcategories which are independent of the structure of the taxonomy;
   identifying, by at least one of the one or more computing devices, a plurality of result information records in the taxonomy which satisfy the attribute condition;
   generating, by at least one of the one or more computing devices, a new category in the ontology; and
   populating, by at least one of the one or more computing devices, the new category in the ontology with a plurality of result nodes corresponding to the plurality of result information records.

8. The method of claim 7, wherein the category is a new subcategory of an existing category in the ontology.

9. The method of claim 7, further comprising:
   identifying, by at least one of the one or more computing devices, a first attribute group associated with a first node in the plurality of result nodes;
   identifying, by at least one of the one or more computing devices, a second attribute group associated with a second node in the plurality of result nodes;
   determining, by at least one of the one or more computing devices, one or more result attributes which are common to the first attribute group and the second attribute group; and
   associating, by at least one of the one or more computing devices, the one or more result attributes with the new category in the ontology.

10. The method of claim 7, wherein the information records are product information records, the one or more tiered categories comprise a plurality of tiered categories, and an attribute associated with a first tier category is associated with all the product information records in the first tier category and inherited by any product information records in a second tier category below the first tier category.

11. The method of claim 7, wherein the attribute condition specifies existence of one or more attributes.

12. The method of claim 7, wherein the attribute condition specifies a value range of one or more attributes.

* * * * *